US009006565B2

(12) United States Patent
Abusleme et al.

(10) Patent No.: US 9,006,565 B2
(45) Date of Patent: Apr. 14, 2015

(54) OPAQUE FLUOROPOLYMER COMPOSITION COMPRISING WHITE PIGMENTS FOR PHOTOVOLTAIC ELEMENTS OF SOLAR CELLS

(75) Inventors: Julio A. Abusleme, Saronno (IT); Mattia Bassi, Milan (IT); Régis Faig, Baverans (FR); Paolo Toniolo, Cesate (IT)

(73) Assignee: Solvay Specialty Polymers Italy S.p.A., Bollate (IT)

( * ) Notice: Subject to any disclaimer, the term of this patent is extended or adjusted under 35 U.S.C. 154(b) by 331 days.

(21) Appl. No.: 13/123,958

(22) PCT Filed: Oct. 15, 2009

(86) PCT No.: PCT/EP2009/063457

§ 371 (c)(1), (2), (4) Date: Jun. 7, 2011

(87) PCT Pub. No.: WO2010/043665

PCT Pub. Date: Apr. 22, 2010

(65) Prior Publication Data

US 2011/0226333 A1 Sep. 22, 2011

(30) Foreign Application Priority Data

Oct. 15, 2009 (EP) .................................... 08166755

(51) Int. Cl.

| | |
|---|---|
| ***H01L 31/04*** | (2014.01) |
| ***H01L 31/048*** | (2014.01) |
| ***C08L 27/12*** | (2006.01) |
| ***C08L 27/16*** | (2006.01) |
| *C08K 3/00* | (2006.01) |
| *C08K 3/22* | (2006.01) |
| *C08L 27/18* | (2006.01) |

(52) U.S. Cl.

CPC ............ *H01L 31/048* (2013.01); *C08K 3/0033* (2013.01); *C08K 3/22* (2013.01); *C08L 27/12* (2013.01); *C08L 27/16* (2013.01); *C08L 27/18* (2013.01); *C08L 2205/02* (2013.01); *Y02E 10/50* (2013.01)

(58) Field of Classification Search

USPC ................................................. 524/420, 520

See application file for complete search history.

(56) References Cited

U.S. PATENT DOCUMENTS

| | | | | |
|---|---|---|---|---|
| 3,503,923 A | | 3/1970 | Petrella et al. | |
| 3,624,250 A | | 11/1971 | Carlson | |
| 3,839,253 A | | 10/1974 | Kershaw | |
| 3,903,045 A | * | 9/1975 | Chandrasekaran et al. | 524/399 |
| 4,314,004 A | | 2/1982 | Stoneberg | |
| 4,423,192 A | * | 12/1983 | Van Lang et al. | 525/199 |
| 4,513,129 A | | 4/1985 | Nakagawa et al. | |
| 4,524,194 A | | 6/1985 | Dumoulin | |
| 4,680,346 A | | 7/1987 | Carson et al. | |
| 4,739,024 A | | 4/1988 | Moggi et al. | |
| 4,770,939 A | * | 9/1988 | Sietses et al. | 428/402 |
| 4,824,728 A | | 4/1989 | Parsons et al. | |
| 4,881,794 A | * | 11/1989 | Bartoszek | 385/102 |
| 5,214,088 A | | 5/1993 | Allen et al. | |
| 5,597,880 A | | 1/1997 | Abusleme et al. | |
| 5,985,983 A | * | 11/1999 | Yamada et al. | 524/520 |
| 6,218,609 B1 | * | 4/2001 | Mori et al. | 136/259 |
| 6,517,940 B1 | | 2/2003 | Millero et al. | |
| 6,524,686 B2 | * | 2/2003 | Strassel | 428/215 |
| 2005/0259300 A1 | | 11/2005 | Burberry et al. | |
| 2006/0001978 A1 | | 1/2006 | Wu et al. | |
| 2006/0166023 A1 | | 7/2006 | Yoshikata et al. | |
| 2007/0078209 A1 | * | 4/2007 | Jozokos et al. | 524/430 |
| 2008/0006323 A1 | | 1/2008 | Kalkanoglu et al. | |
| 2008/0124556 A1 | | 5/2008 | Kernander et al. | |

FOREIGN PATENT DOCUMENTS

| | | |
|---|---|---|
| EP | 1849828 A1 | 10/2007 |
| EP | 1938967 A1 | 7/2008 |
| GB | 1049089 A | 11/1966 |
| JP | 61072046 A | 4/1986 |
| JP | 02163132 A | 6/1990 |
| JP | 07014431 A | 1/1995 |
| JP | 20020161180 A | 6/2002 |
| WO | WO 2007079246 A2 | 7/2007 |
| WO | WO 2007079247 A2 | 7/2007 |

OTHER PUBLICATIONS

Standard ASTM D1003-00—"Standard Test Method for Haze and Luminous Transmittance of Transparent Plastics", 2000, p. 1-6; 6 pgs.

Standard ASTM E313-05—"Standard Practice for Calculating Yellowness and Whiteness Indices from Instrumentally Measured Color Coordinates", 2005, p. 1-6; 6 pgs.

Alger, Mark S.M.—Definition of "Thermoplastic", Polymer Science Dictionary, 1989, p. 476, London School of Polymer Technology, Polytechnic of North London, UK, published by Elsevier Applied Science; 3 pgs.

* cited by examiner

*Primary Examiner* — Nicole M Buie-Hatcher

(74) *Attorney, Agent, or Firm* — Osha • Liang LLP

(57) ABSTRACT

A fluoropolymer composition having a total luminous transmittance (TT) of less than 15%, when measured according to ASTM D1003 on a sample having a thickness of about 50 μm, said composition comprising: at least one hydrogen-containing fluoropolymer [polymer (A)]; from 5 to 80% by weight of (A) of at least one inorganic pigment [pigment (I)]; and from 1 to 99% by weight of (I) of at least one per(halo)fluoropolymer chosen among tetrafluoroethylene (TFE) copolymers having a dynamic viscosity at a shear rate of 1 rad×sec$^{-1}$ of less than 100 Pa×sec at a temperature of 280° C. [polymer (B)]. By adding polymer (B) to the composition based on polymer (A) it is advantageously possible to obtain an even dispersion of the pigment (I) so that a composition possessing outstanding opacity and still being processable under the form of films, so as to provide adequate mechanical properties, can be manufactured therefrom.

14 Claims, No Drawings

OPAQUE FLUOROPOLYMER COMPOSITION COMPRISING WHITE PIGMENTS FOR PHOTOVOLTAIC ELEMENTS OF SOLAR CELLS

CROSS-REFERENCE TO RELATED APPLICATIONS

This application is a U.S. national stage entry under 35 U.S.C. §371 of International Application No. PCT/EP2009/063457 filed Oct. 15, 2009, which claims priority to European Application No. 08166755.2 filed Oct. 16, 2008, this application being herein incorporated by reference in its entirety for all purposes.

TECHNICAL FIELD

This invention pertains to certain partially fluorinated polymer compositions comprising high amount of inorganic fillers, to their manufacture and to their use for the manufacture certain parts of photovoltaic cells.

BACKGROUND ART

In recent years, heating of the earth because of the so-called greenhouse effect due to an increase of atmospheric $CO_2$ has been predicted. In view of this, there is an increased demand for a means of power generation capable of providing clean energy without causing $CO_2$ buildup. Among various proposals which are expected to meet such societal demand, solar cells providing photoelectric conversion are expected to be a future power generation source since they supply electric power notably without consumption of fossil combustible and without emission of $CO_2$ and/or of other pollutants.

Solar cell modules generally comprise at least one photovoltaic element encapsulated between a front layer on its light receiving surface side and a back layer. Front layer, often glazed with glass, is generally provided for assuring weather resistance, anti-scratch and impact resistance, heat resistance, but still enabling access to maximum photoelectric conversion efficiency thanks to transparency in the whole visible spectrum.

On the other side, backside of the module is often covered with a backing layer, generally composed of polymer films and laminates.

The backing layer is generally intended to provide weatherability, physical protection, electrical insulation and moisture protection of the wiring and other sensitive components of the module, while adhering to the other parts of the module. This back layer is typically required to be opaque, so as to provide suitable protection against solar radiation of possibly sensitive layers/components located behind it. Also, in order to minimize losses of light radiation power, it may be required for this back layer to possess reflecting capabilities. Finally, adequate mechanical properties are required.

Among solutions proposed up to now as back-layer, composites comprising a fluoropolymer layer, in particular vinylidene fluoride (VDF) polymer or vinylfluoride (PVF) polymer layers, possibly coupled with other polymer layers (e.g. polyethylene terephthalate) have been proposed in the past.

Nevertheless, fluoropolymer composition providing films fulfilling above mentioned features are still a shortfall in the art.

Actually, fluoropolymer compositions, in particular VDF polymer compositions, comprising inorganic pigments, in particular Zn-based white pigments, are known in the art. Compositions comprising VDF and ZnO or ZnS are notably disclosed in GB 1049089 (PENNSALT CHEMICALS CORP) Nov. 23, 1966, U.S. Pat. No. 4,314,004 (PPG INDUSTRIES INC) Feb. 2, 1982, U.S. Pat. No. 3,839,253 (BALM PAINTS LTD) Jan. 10, 1974.

As mentioned, said compositions have already found application as reflecting/opaque layers in light/optical-related applications, including photovoltaic modules.

Thus, U.S. 2006001978 (ETERNAL CHEMICAL CO LTD) May 1, 2006 discloses a UV-resistant film useful in LCDs as reflective film for back light source, made from a substrate film layer coated with a fluororesin (e.g. a VDF, VF or chlorotrifluoroethylene (CTFE) polymer) admixed with inorganic particles (e.g. ZnO particles) and a fluorescent agent, e.g. ZnS.

Also, WO 2007/079246 (DU PONT (US)) Dec. 7, 2007 and WO 2007/079247 (DU PONT (US)) Dec. 7, 2007 disclose a fluoropolymer coated film useful as backsheet in a photovoltaic module, said film comprising:

a polymer film, preferably a polyester film (providing electrical insulation and moisture barrier properties);

a fluoropolymer coating layer, preferably based on VDF or VF polymers, further comprising pigments or fillers (e.g. metallic oxides; sulfides) having high thermal stability and/or barriers particles (able to reduce permeation to water, solvents and gases), like notably mica particles coated with e.g. ZnO.

Nevertheless, while maximization of inorganic fillers content, in particular of Zn-based fillers content, in the fluororesin composition is recommended for achieving required opacity, whiteness and reflecting properties, processability of composition thereof for manufacturing films is generally heavily affected, so that films of adequate mechanical properties are actually not available.

DISCLOSURE OF INVENTION

The invention hereby provides a fluoropolymer composition having a total luminous transmittance of less than 15%, when measured according to ASTM D1003 on a sample having a thickness of about 50 μm, said composition comprising:

at least one hydrogen-containing fluoropolymer [polymer (A)]; and from 5 to 80% by weight of (A) of at least one inorganic pigment [pigment (I)]

from 1 to 99% by weight of (I) of at least one per(halo) fluoropolymer chosen among tetrafluoroethylene (TFE) copolymers having a dynamic viscosity at a shear rate of 1 rad×$sec^{-1}$ of less than 100 Pa×sec at a temperature of 280° C. [polymer (B)].

The Applicant has surprisingly found that by adding polymer (B) to the composition based on polymer (A) it is advantageously possible to obtain an even dispersion of the pigment (I) so that a composition possessing outstanding opacity and still being processable under the form of films, so that films with fewer (if any) defects (e.g. like fish eyes) and adequate mechanical properties can be manufactured therefrom.

As per the mechanical properties of film obtained from the composition of the invention, the Applicant has surprisingly found that high values of elongation at break are obtained, in particular in the machine direction in case of extruded films: these properties enable efficient lamination with other plastic or non plastic layer(s).

It is essential for the fluoropolymer material to be suitable as component of a back sheet of a solar cell module to possess said total luminous transmittance of less than 15%, as above detailed; this means that the material can provide suitable opacity as required for this particular application. Compositions having total luminous transmittance exceeding above limit are considered not suitable for this application, as unable to provide above mentioned advantages.

The expression 'thickness of about 50 μm' shall be construed according to standard meanings, including typical variance of +/−5 μm.

The fluoropolymer composition has preferably a total luminous transmittance (TT) of less 10%, preferably of less than 7% when measured according to ASTM D1003 on a sample having a thickness of about 50 μm.

As total luminous transmittance (TT) can be calculated on samples of different thickness, it can be easier to compare optical properties of the composition of the invention by deriving from above mentioned total luminous transmittance, as measured according to ASTM D1003, the 'optical absorbance' (α) parameter, which is indeed independent from thickness, following equation:

$$\alpha(\mathrm{cm}^{-1}) = -\mathrm{Log}_{10}(\mathrm{TT})/t$$

wherein t is the thickness of the sample in cm.

A TT of less than 15% for a sample thickness of 50 μm indeed corresponds to an α value of more than 165 $cm^{-1}$.

It is thus understood that the composition of the invention indeed advantageously possesses an α value of more than 165 $cm^{-1}$, preferably of more than 200 $cm^{-1}$, more preferably of more than 230 $cm^{-1}$.

It is also generally required for a material to be used as back sheet in a solar cell module to behave similarly to a perfect reflecting diffuser, that is to say to behave as an ideal reflecting surface that neither absorbs nor transmits light, but reflects diffusely impingent light; this behaviour is generally quantitatively determined by reference to yellowness and whiteness indices, e.g. as provided by ASTM E313 standard.

The whiteness index (WI) is actually a number, computed from colorimetric data (see ASTM E313), that indicates the degree of departure of a material colour from that of 'preferred white', that is to say from that of above mentioned perfect reflecting diffuser, the higher the WI, the greater being the whiteness of the material.

On the other hand, yellowness index (YI) is another numeric parameter, computed from colorimetric data (see ASTM E313), that indicates the degree of departure of a material colour from colourless or white towards yellow, the higher the YI, the greater being the yellowness of the material.

The fluoropolymer composition of the invention possesses advantageously a WI of at least 80, preferably of at least 85, more preferably at least 90.

The fluoropolymer composition of the invention possesses advantageously a YI of at most 10, preferably of at most 7.5, more preferably at most 5.

Within the context of the present invention the mention "at least one thermoplastic hydrogen-containing fluoropolymer (A)" is intended to denote one or more than one polymer (A). Mixtures of polymers (A) can be advantageously used for the purposes of the invention.

In the rest of the text, the expressions "thermoplastic hydrogen-containing fluoropolymer" and "polymer (A)" are understood, for the purposes of the present invention, both in the plural and the singular, that is to say that the inventive composition may comprise one or more than one polymer (A).

The polymer (A) of the invention is preferably thermoplastic. The term "thermoplastic" is understood to mean, for the purposes of the present invention, polymers existing, at room temperature, below their glass transition temperature, if they are amorphous, or below their melting point if they are semi-crystalline, and which are linear (i.e. not reticulated). These polymers have the property of becoming soft when they are heated and of becoming rigid again when they are cooled, without there being an appreciable chemical change. Such a definition may be found, for example, in the encyclopaedia called "Polymer Science Dictionary", Mark S. M. Alger, London School of Polymer Technology, Polytechnic of North London, UK, published by Elsevier Applied Science, 1989.

Thermoplastic polymers are thus distinguishable from elastomers. To the purpose of the invention, the term "elastomer" is intended to designate a true elastomer or a polymer resin serving as a base constituent for obtaining a true elastomer. True elastomers are defined by the ASTM, Special Technical Bulletin, No. 184 standard as materials capable of being stretched, at room temperature, to twice their intrinsic length and which, once they have been released after holding them under tension for 5 minutes, return to within 10% of their initial length in the same time. Polymer resins serving as a base constituent for obtaining true elastomers are in general amorphous products having a glass transition temperature ($T_g$) below room temperature. In most cases, these products correspond to copolymers having a $T_g$ below 0° C. and including reactive functional groups (optionally in the presence of additives) allowing the true elastomer to be formed.

Preferably, the thermoplastic hydrogen-containing fluoropolymer [polymer (A)] of the invention is semi-crystalline.

The term "semi-crystalline" is intended to denote a polymer having a heat of fusion of more than 1 J/g when measured by Differential Scanning Calorimetry (DSC) at a heating rate of 10° C./min, according to ASTM D 3418.

Preferably, the polymer (A) of the invention has a heat of fusion of at least 10 J/g, more preferably of at least 30 J/g.

To the purpose of the present invention, "fluoropolymer" is intended to denote any polymer comprising more than 15% moles of recurring units derived from at least one ethylenically unsaturated monomer comprising at least one fluorine atom (hereinafter, fluorinated monomer).

The fluoropolymer comprises preferably more than 20% moles, more preferably more than 30% moles of recurring units derived from the fluorinated monomer.

The fluorinated monomer can further comprise one or more other halogen atoms, in particular chlorine. Shall the fluorinated monomer be free of hydrogen atom, it is designated as per(halo)fluoromonomer. Shall the fluorinated monomer comprise at least one hydrogen atom, it is designated as hydrogen-containing fluorinated monomer.

Non limitative examples of fluorinated monomers are notably tetrafluoroethylene (TFE), vinylidene fluoride (VdF), chlorotrifluoroethylene (CTFE), and mixtures thereof.

Optionally, the fluoropolymer may comprise recurring units derived one first monomer, said monomer being a fluorinated monomer as above described, and at least one other monomer (hereinafter, the comonomer).

Hereinafter, the term comonomer should be intended to encompass both one comonomer and two or more comonomers.

The comonomer can notably be either hydrogenated (i.e. free of fluorine atom) or fluorinated (i.e. containing at least one fluorine atom).

Non limitative examples of suitable hydrogenated comonomers are notably ethylene, propylene, vinyl monomers such as vinyl acetate, acrylic monomers, like methyl methacrylate, acrylic acid, methacrylic acid and hydroxyethyl acrylate, as well as styrene monomers, like styrene and p-methylstyrene.

Non limitative examples of suitable fluorinated comonomers are notably:

—$C_3$-$C_8$ fluoro- and/or perfluoroolefins, such as hexafluoropropene, pentafluoropropylene, and hexafluoroisobutylene;

—$C_2$-$C_8$ hydrogenated monofluoroolefins, such as vinyl fluoride;

1,2-difluoroethylene, vinylidene fluoride and trifluoroethylene;

perfluoroalkylethylenes complying with formula $CH_2$=CH—$R_{f0}$, in which $R_{f0}$ is a $C_1$-$C_6$ perfluoroalkyl;

chloro- and/or bromo- and/or iodo-$C_2$-$C_6$ fluoroolefins, like chlorotrifluoroethylene;

fluoroalkylvinylethers complying with formula $CF_2$=CFO$R_{f1}$ in which $R_{f1}$ is a $C_1$-$C_6$ fluoro- or perfluoroalkyl, e.g. —$CF_3$, —$C_2F_5$, —$C_3F_7$;

fluoro-oxyalkylvinylethers complying with formula $CF_2$=CFO$X_0$, in which $X_0$ is a a $C_1$-$C_{12}$ oxyalkyl, or a $C_1$-$C_{12}$ (per)fluorooxyalkyl having one or more ether groups, like perfluoro-2-propoxy-propyl;

fluoroalkyl-methoxy-vinylethers complying with formula $CF_2$=CFO$CF_2$O$R_{f2}$ in which $R_{f2}$ is a $C_1$-$C_6$ fluoro- or perfluoroalkyl, e.g. —$CF_3$, —$C_2F_5$, —$C_3F_7$ or a $C_1$-$C_6$ (per)fluorooxyalkyl having one or more ether groups, like —$C_2F_5$—O—$CF_3$;

fluorodioxoles, of formula:

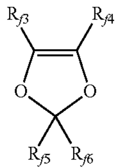

wherein each of $R_{f3}$, $R_{f4}$, $R_{f5}$, $R_{f6}$, equal or different each other, is independently a fluorine atom, a $C_1$-$C_6$ fluoro- or per(halo)fluoroalkyl, optionally comprising one or more oxygen atom, e.g. —$CF_3$, —$C_2F_5$, —$C_3F_7$, —$OCF_3$, —$OCF_2CF_2OCF_3$.

By "hydrogen-containing fluoropolymer" it is meant a fluoropolymer as above defined comprising recurring units derived from at least one hydrogen-containing monomer. Said hydrogen-containing monomer may be the same monomer as the fluorinated monomer or can be a different monomer.

Thus, this definition encompasses notably copolymers of one or more per(halo)fluoromonomer (for instance tetrafluoroethylene, chlorotrifluoroethylene, hexafluoropropylene, perfluoroalkylvinylethers, etc.) with one or more hydrogenated comonomer(s) (for instance ethylene, propylene, vinylethers, acrylic monomers, etc.), and/or homopolymers of hydrogen-containing fluorinated monomers (for instance vinylidene fluoride, trifluoroethylene, vinyl fluoride, etc.) and their copolymers with fluorinated and/or hydrogenated comonomers.

The hydrogen-containing fluoropolymer is preferably chosen among:

(A-1) TFE and/or CTFE copolymers with ethylene, propylene or isobutylene (preferably ethylene), with a molar ratio per(halo)fluoromonomer(s)/hydrogenated comonomer(s) of from 30:70 to 70:30, optionally containing one or more comonomers in amounts of from 0.1 to 30% by moles, based on the total amount of TFE and/or CTFE and hydrogenated comonomer(s) (see for instance U.S. Pat. No. 3,624,250 and U.S. Pat. No. 4,513,129);

(A-2) Vinylidene fluoride (VDF) polymers, optionally comprising recurring units, in amount generally comprised between 0.1 and 15% by moles, derived from one or more fluorinated comonomer(s) different from VDF (see for instance U.S. Pat. No. 4,524,194 and U.S. Pat. No. 4,739,024), and optionally further comprising one or more hydrogenated comonomer(s); and mixtures thereof.

The CTFE or TFE copolymers (A-1) preferably comprise:

(a) from 35 to 65%, preferably from 45 to 55%, more preferably from 48 to 52% by moles of ethylene (E);

(b) from 65 to 35%, preferably from 55 to 45%, more preferably from 52 to 48% by moles of chlorotrifluoroethylene (CTFE) (for the ECTFE polymers, hereinafter) or tetrafluoroethylene (TFE) (for the ETFE polymers, herein after); and optionally;

(c) from 0.1 to 30%, by moles, preferably 0.1 to 10% by moles, more preferably 0.1 to 5% by moles, based on the total amount of monomers (a) and (b), of one or more fluorinated comonomer(s) (c1) and/or hydrogenated comonomer(s) (c2).

Among fluorinated comonomers (c1), we can for example mention (per)fluoroalkylvinylethers, perfluoroalkylethylenes (such as perfluorobutylethylene), (per)fluorodioxoles as described in U.S. Pat. No. 5,597,880, vinylidenefluoride (VdF). Among them, preferred (c1) comonomer is perfluoropropylvinylether of formula $CF_2$=CFO—$C_3F_7$.

Among comonomers (c), hydrogenated comonomers (c2) are preferred.

As non limitative examples of hydrogenated comonomers (c2), mention may be notably made of those having the general formula:

$$CH_2{=}CH{-}(CH_2)_nR_1 \quad (I)$$

wherein $R_1$=$OR_2$, or —$(O)_tCO(O)_pR_2$ wherein t and p are integers equal to 0, 1 and $R_2$ is a hydrogenated radical $C_1$-$C_{20}$ from 1 to 20 carbon atoms, of alkyl type, linear or branched when possible, or cycloalkyl, optionally containing heteroatoms and/or chlorine atoms, the heteroatoms preferably being O or N, $R_2$ optionally contains one or more functional groups, preferably selected from OH, COOH, epoxide, ester and ether, $R_2$ optionally contains double bonds, or $R_2$ is H, n is an integer in the range 0-10. Preferably $R_2$ is of alkyl type from 1 to 10 carbon atoms containing functional groups of hydroxide type, n is an integer in the range 0-5.

The preferred hydrogenated comonomers (c2) are selected from the following classes:

1. Acrylic monomers having the general formula:

$$CH_2{=}CH{-}CO{-}O{-}R_2$$

wherein $R_2$ has the above mentioned meaning. As non limitative examples of suitable acrylic monomers, mention can be notably made of ethylacrylate, n-butylacrylate, acrylic acid, hydroxyethylacrylate, hydroxypropylacrylate, (hydroxy)ethylhexylacrylate;

2. Vinylether monomers having the general formula:

$$CH_2{=}CH{-}O{-}R_2$$

wherein $R_2$ has the above mentioned meaning. As non limitative examples of suitable vinylether monomers, mention can be notably made of propylvinylether, cyclohexylvinylether, vinyl-4-hydroxybutylether;

3. Vinyl monomers of the carboxylic acid having the general formula:

$$CH_2{=}CH{-}O{-}CO{-}R_2$$

wherein $R_2$ has the above mentioned meaning. As non limitative examples of suitable vinyl monomers of the carboxylic acid, mention can be notably made of vinyl-acetate, vinylpropionate, vinyl-2-ethylhexanoate;

4. Unsaturated carboxylic acid monomers having the general formula:

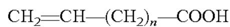

$CH_2$═CH—$(CH_2)_n$—COOH wherein n has the above mentioned meaning. As non limitative example of suitable unsaturated carboxylic acid monomer, mention can be notably made of vinylacetic acid.

More preferred comonomer (c2) is n-butylacrylate.

Among A-1 polymers, ECTFE polymers are preferred.

The melt index of the ECTFE is advantageously at least 0.01, preferably at least 0.05, more preferably at least 0.1 g/10 min.

The melt index of the ECTFE is advantageously at most 100, preferably at most 50, more preferably at most 30.

The melt index of ECTFE is measured in accordance with modified ASTM test No. 1238, run at 275° C., under a piston load of 2.16 kg.

The ECTFE has a melting point advantageously of at least 150° C. and at most 265° C. The melting point is determined by Differential Scanning Calorimetry (DSC) at a heating rate of 10° C./min, according to ASTM D 3418 Standard.

Particularly adapted to thermoplastic fluoropolymer composition of the invention is ECTFE available from Solvay Solexis Inc., Thorofare, N.J., USA, under the tradename HALAR® and VATAR®.

More preferably, the hydrogen-containing fluoropolymer is a VDF polymer (A-2).

The VDF polymer (A-2) preferably comprises:

(a') at least 60% by moles, preferably at least 75% by moles, more preferably 85% by moles of vinylidene fluoride (VDF);

(b') optionally from 0.1 to 15%, preferably from 0.1 to 12%, more preferably from 0.1 to 10% by moles of a fluorinated comonomer chosen among vinylfluoride (VF), chlorotrifluoroethylene (CTFE), hexafluoropropene (HFP), tetrafluoroethylene (TFE), perfluoromethylvinylether (MVE), trifluoroethylene (TrFE) and mixtures therefrom; and (c') optionally from 0.1 to 5%, by moles, preferably 0.1 to 3% by moles, more preferably 0.1 to 1% by moles, based on the total amount of monomers (a') and (b'), of one or more hydrogenated comonomer(s).

As non limitative examples of the VDF polymers useful in the present invention, mention can be notably made of homopolymers of VDF, VDF/TFE copolymers, VDF/TFE/HFP copolymers, VDF/TFE/CTFE copolymers, VDF/TFE/TrFE copolymers, VDF/CTFE copolymers, VDF/HFP copolymers, VDF/TFE/HFP/CTFE copolymers, VDF/TFE/perfluorobutenoic acid copolymers, VdF/TFE/maleic acid copolymers and the like.

The melt index of the VDF polymer is advantageously at least 0.01, preferably at least 0.05, more preferably at least 0.1 g/10 min.

The melt index of the VDF polymer is advantageously at most 50, preferably at most 25 g/10 min.

The melt index of VDF polymer is measured in accordance with ASTM test No. 1238, run at 230° C., under a piston load of 2.16 kg.

The VDF polymer has a melting point advantageously of at least 120° C., preferably at least 135° C., more preferably at least 150° C.

The VDF polymer has a melting point advantageously of at most 190° C., preferably at most 185° C., more preferably at most 180° C.

The melting point ($T_{m2}$) is determined by DSC, at a heating rate of 10° C./min, according to ASTM D 3418.

Pigment (I) is generally selected among oxides, sulfides, oxides hydroxides, silicates, sulfates, carbonates and mixtures thereof.

White inorganic pigments are preferred in the composition of the invention.

Among white pigments suitable for the composition of the invention mention can be made of $TiO_2$ pigments (e.g. rutile, anatase), Zinc oxide (ZnO) pigments (e.g. Zinc white, Chinese white or flowers of Zinc), Zinc sulphide (ZnS) pigments, lithopone (mixed pigment produced from Zinc sulphide and barium sulphate) pigments, white lead pigments (basic lead carbonate), Barium sulphate, and corresponding complex pigments obtained from coating of above mentioned pigments on suitable inorganic carriers, e.g. silicates, aluminosilicates, mica and the like.

Particularly preferred pigments (I) are Zinc oxide and Zinc sulphide pigments.

The composition of the invention comprises at least 5%, preferably at least 10%, more preferably at least 15% by weight of (A) of the pigment (I).

The composition of the invention comprises up to 80%, preferably up to 75%, more preferably up to 70% by weight of (A) of the pigment (I).

Polymer (B) of the invention is a "per(halo)fluoropolymer". For the purpose of the invention, the term "per(halo) fluoropolymer" is intended to denote a fluoropolymer substantially free of hydrogen atoms.

The term "substantially free of hydrogen atom" is understood to mean that the per(halo)fluoropolymer consists essentially of recurring units derived from ethylenically unsaturated monomers comprising at least one fluorine atom and free of hydrogen atoms (per(halo)fluoromonomer).

The per(halo)fluoropolymer is advantageously melt-processable.

For the purposes of the present invention, by the term "melt-processable" is meant that the per(halo)fluoropolymer can be processed (i.e. fabricated into shaped articles such as films, fibers, tubes, wire coatings and the like) by conventional melt extruding, injecting or casting means.

The term tetrafluoroethylene (TFE) copolymer is intended to encompass per(halo)fluoropolymers comprising recurring units derived from tetrafluoroethylene and from at least one other per(halo)fluoromonomer (PFM) as above described different from TFE.

The TFE copolymer [polymer (B)] of the invention comprises advantageously at least 0.5% by moles, preferably at least 5% by moles, more preferably at least 7% by moles of recurring units derived from the per(halo)fluoromonomer (PFM) different from TFE, with respect to the total moles of recurring units.

The TFE copolymer [polymer (B)] of the invention comprises advantageously at most 30% by moles, preferably at most 25% by moles, more preferably at most 23% by moles of recurring units derived from the per(halo)fluoromonomer (PFM) different from TFE, with respect to the total moles of recurring units.

Per(halo)fluoromonomers (PFM) different from TFE are notably chosen among:

—$C_3$-$C_8$ perfluoroolefins, such as hexafluoropropene (HFP);

chloro- and/or bromo- and/or iodo-$C_2$-$C_6$ per(halo)fluoroolefins, like chlorotrifluoroethylene;

per(halo)fluoroalkylvinylethers complying with general formula $CF_2$═$CFOR_{f3}$ in which $R_{f3}$ is a $C_1$-$C_6$ per(halo)fluoroalkyl, such as —$CF_3$, —$C_2F_5$, —$C_3F_7$;

per(halo)fluoro-oxyalkylvinylethers complying with general formula $CF_2{=}CFOX_{01}$, in which $X_{01}$ is a $C_1$-$C_{12}$ per(halo)fluorooxyalkyl having one or more ether groups, like perfluoro-2-propoxy-propyl group;

per(halo)fluoro-methoxy-alkylvinylethers complying with general formula $CF_2{=}CFOCF_2OR_{f4}$ in which $R_{f4}$ is a $C_1$-$C_6$ per(halo)fluoroalkyl, such as —$CF_3$, —$C_2F_5$, —$C_3F_7$ or a $C_1$-$C_6$ per(halo)fluorooxyalkyl having one or more ether groups, such as —$C_2F_5$—O—$CF_3$;

per(halo)fluorodioxoles of formula:

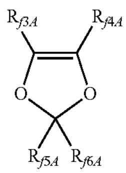

wherein each of $R_{f3A}$, $R_{f4A}$, $R_{f5A}$, $R_{f6A}$, equal of different each other, is independently a fluorine atom, a $C_1$-$C_6$ perfluoroalkyl group, optionally comprising one or more oxygen atom, e.g. —$CF_3$, —$C_2F_5$, —$C_3F_7$, —$OCF_3$, —$OCF_2CF_2OCF_3$.

Preferred TFE copolymers are those comprising recurring units derived from at least one per(halo)fluoromonomer (PFM) chosen among the group consisting of:

perfluoroalkylvinylethers complying with formula $CF_2{=}CFOR^{f1'}$, in which $R_{f1'}$ is a $C_1$-$C_6$ perfluoroalkyl, e.g. —$CF_3$, —$C_2F_5$, —$C_3F_7$, and/or perfluoro-oxyalkylvinylethers complying with formula $CF_2{=}CFOX_0$, in which $X_0$ is a $C_1$-$C_{12}$ perfluorooxyalkyl having one or more ether groups, like perfluoro-2-propoxy-propyl; and/or $C_3$-$C_8$ perfluoroolefins, such as hexafluoropropylene;

per(halo)fluorodioxoles of formula:

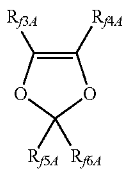

wherein each of $R_{f3A}$, $R_{f4A}$, $R_{f5A}$, $R_{f6A}$, equal of different each other, is independently a fluorine atom, a $C_1$-$C_6$ perfluoroalkyl group, optionally comprising one or more oxygen atom, e.g. —$CF_3$, —$C_2F_5$, —$C_3F_7$, —$OCF_3$, —$OCF_2CF_2OCF_3$, preferably a per(halo)fluorodioxole as above described, wherein $R_{f3A}$ and $R_{f4A}$ are fluorine atoms and $R_{f5A}$ and $R_{f6A}$ are perfluoromethyl groups (—$CF_3$) [perfluoro-2,2-dimethyl-1,3-dioxole (PDD)], or wherein $R_{f3}$, $R_{f5}$ and $R_{f6}$ are fluorine atoms and $R_{f4}$ is a perfluoromethoxy group (—$OCF_3$) [2,2,4-trifluoro-5-trifluoromethoxy-1,3-dioxole or perfluoromethoxydioxole (MDO)].

More preferred TFE copolymers are those comprising recurring units derived from at least one perfluoroalkylvinylether (PAVE) complying with formula $CF_2{=}CFOR_{f1'}$, in which $R^{f1'}$, is a $C_1$-$C_6$ perfluoroalkyl.

The expression "at least one perfluoroalkylvinylether" is understood to mean that the TFE/PAVE copolymer can comprise recurring units derived from one or more than one perfluoroalkylvinylether as above described.

As used herein, the term perfluoroalkylvinylether is understood, for the purposes of the present invention, both in the plural and the singular.

Good results have been obtained with TFE/PAVE copolymers comprising recurring units derived from at least one perfluoroalkylvinylether complying with formula $CF_2{=}CFOR_{f7'}$, in $R_{f7'}$ is a group chosen among —$CF_3$, —$C_2F_5$, —$C_3F_7$.

Excellent results have been obtained with TFE/PAVE copolymers comprising recurring units derived from perfluoromethylvinylether (of formula $CF_2{=}CFOCF_3$) (MVE, hereinafter).

TFE/PAVE copolymers may also comprise recurring units derived from at least one per(halo)fluoromonomer different from TFE and perfluoroalkylvinylether as above described. In particular, TFE/PAVE copolymers may comprise recurring units derived from perfluoro-oxyalkylvinylethers as above described, and/or $C_3$-$C_5$ perfluoroolefins as above described (e.g. hexafluoropropylene), and/or per(halo)fluorodioxoles as above described.

According to an embodiment of the invention, polymer (B) is advantageously chosen among TFE/PAVE copolymers consisting essentially of recurring units derived from TFE and at least one perfluoroalkylvinylether as above detailed. It is understood that the TFE/PAVE copolymers can comprises other moieties, such as end-groups, defects and the like, which do not substantially affect the properties of said materials.

According to this embodiment of the invention, polymer (B) is preferably a copolymer consisting essentially of recurring units derived from TFE and from MVE.

The polymer (B) according to this embodiment is more preferably a TFE/MVE copolymer consisting essentially of:

from 3 to 25% by moles, preferably from 5 to 20% by moles, more preferably from 8 to 18% by moles, even more preferably from 10 to 15% by moles of recurring units derived from MVE; and from 97 to 75% by moles, preferably from 95 to 80% by moles, more preferably from 92 to 82% by moles, even more preferably from 90 to 85% by moles of recurring units derived from TFE.

The polymer (B) of the invention has a dynamic viscosity at a shear rate of 1 rad×$sec^{-1}$ of less than 100 Pa×sec, preferably of less than 80 Pa×sec, more preferably of less than 50 Pa×sec, most preferably of less than 30 Pa×sec at a temperature of 280° C.

Dynamic viscosity is advantageously determined according to ASTM D 4440 standard, following equations listed in Practice ASTM D 4065 to determine "Complex viscosity, $\eta^*$" at 1 rad×$sec^{-1}$.

Dynamic viscosity is typically measured with a controlled strain rheometer, employing an actuator to apply a deforming strain to the sample and a separate transducer to measure the resultant stress developed within the sample, using the parallel plate fixture.

The composition of the invention comprises at least 1%, preferably at least 2%, more preferably at least 5% by weight of (I) of the polymer (B).

The composition of the invention comprises up to 99%, preferably up to 50%, more preferably up to 25% by weight of (I) of the polymer (B).

The invention also pertains to a process for the manufacture of the fluoropolymer composition as above detailed.

The process of the invention advantageously comprises mixing the polymer (A), the pigment (I) and the polymer (B).

Mixing can be accomplished by standard methods.

Preferably, the pigment (I) and the polymer (B), both under the form of powder are mixed in order to obtain a powdery mixture thereof. Usual mixing devices like static mixers, high intensity mixers can be used. High intensity mixers are preferred for obtaining better mixing efficiency.

Said powdery mixture is typically mixed with polymer (A).

The mixture of polymer (A), pigment (I) and polymer (B) is preferably melt compounded for obtaining a molten composition. Generally, melt compounding is carried out in an extruder. Composition is typically extruded though a die to yield strands which are cut for providing pellets.

Twin screw extruders are preferred devices for accomplishing melt compounding of the composition of the invention.

Generally, said mixture and the polymer (A) are firstly mixed in the solid state and then melt compounded as above detailed; usual mixing devices like static mixers, high intensity mixers can be used. High intensity mixers are preferred for obtaining better mixing efficiency.

The invention also pertains to films or sheets comprising the composition as above detailed.

Films or sheets can be manufactured from the composition of the invention by traditional methods.

Films or sheets can be obtained by extrusion moulding, blow moulding, casting the composition of the invention.

Preferably, films or sheets are manufactured by extrusion moulding.

According to this technique, a strand is extruded through a die so as to obtain a molten tape, which is then calibrated and stretched in the two directions until obtaining required thickness and wideness.

Particularly preferred films or sheets are those having a thickness of less than 250 μm, preferably of less than 200 μm, more preferably of less than 150 μm.

The invention also pertains to the use of said films or sheets in a solar cell module.

In particular, said films or sheets are useful for manufacturing back-sheet layers of solar cell modules.

Still an object of the invention is a solar cell module comprising at least one photovoltaic element encapsulated between a front layer on its light receiving surface side and a back layer, said back layer comprising at least one layer comprising the composition of the invention as above detailed.

The Applicant has found that the back layer as above detailed enables achieving optimum opacity towards impingent light possibly transmitted through the photovoltaic element, by maximizing reflection of the same towards said element, while still maintaining electric insulation between the conductive substrate of the photovoltaic element and the exterior, and adequate mechanical protection.

The photovoltaic elements of the solar cell module of the invention are well known to those skilled in the art; said photovoltaic element is generally formed of a semiconductor photoactive layer (i.e. the layer endowed of photoelectric conversion property) sandwiched between an electroconductive substrate and a transparent conductive layer.

The electroconductive substrate serves as a base member for the photovoltaic element as well as a lower-side electrode. Examples of materials thereof include silicon, tantalum, molybdenum, tungsten, stainless steel, aluminium, copper, titanium, carbon sheet, lead-plated steel, and resin films, and ceramics and glass having an electroconductive layer formed thereon. On the above electroconductive substrate, a backside reflection layer may be formed from a metal layer, a metal oxide layer, or a lamination thereof. The metal layer can be formed from Ti, Cr, Mo, W, Al, Ag, Ni, Cu, and the like. The metal oxide layer can be formed from ZnO, $TiO_2$, $SnO_2$, $In_2O_3$—$SnO_2$ (ITO), and the like. The metal layer and the metal oxide layer may be formed by resistance heating vapor deposition, electron beam vapor deposition, sputtering, or like method.

The semiconductor photoactive layer is intended to perform photovoltaic conversion. The specific materials used for forming such semiconductor photoactive layer include single crystal silicon semiconductor, non-single crystal silicon semiconductor (e.g. an amorphous silicon (a-Si) semiconductor or a polycrystalline silicon semiconductor), compound semiconductors and junctions such as $CuInSe_2$, $CuInS_2$, GaAs, CdS/$Cu_2S$, CdS/CdTe, CdS/InP, and CdTe/$Cu_2Te$, and organic semiconductors such as polymers and small-molecule compounds like polyphenylene vinylene, copper phthalocyanine (a blue or green organic pigment) and carbon fullerenes.

The semiconductor photoactive layer formed of either of the above semiconductor has generally a laminated structure with a "pn junction", "pin junction" or Schottky junction.

A transparent electroconductive layer serves as an upper-side electrode (i.e. the light receiving surface). Specific examples of the material therefore include $In_2O_3$, $SnO_2$, $In_2O_3$—$SnO_2$ (ITO), ZnO, $TiO_2$, $Cd_2SnO_4$, crystalline semiconductor layers doped with a high concentration of an impurity, like notably fluorine-doped tin oxide ($SnO_2$:F, or "FTO"), doped zinc oxide (e.g.: ZnO:Al) and flexible organic conductors, like, e.g. carbon nanotube networks embedded in a transparent polymer matrix.

The layer may be formed by resistance-heating vapor deposition, sputtering, spraying, chemical vapour deposition (CVD), impurity diffusion, and like methods. In case of flexible organic conductors, typical polymer processing technologies are also available, including laminating, casting, extrusion and the like.

On the transparent electroconductive layer, a grid type collecting electrode (grid) may be provided in order to efficiently collect the generated current. Specific examples of the material for the collecting electrode include Ti, Cr, Mo, W, Al, Ag, Ni, Cu, Sn, and alloys thereof, and an electroconductive paste such as silver paste. The collecting electrode may be formed by sputtering, resistance heating, and CVD employing a mask pattern; metal film deposition and subsequent etching for patterning; direct grid electrode pattern formation by photo-assisted CVD; formation of a negative pattern mask of the grid electrode and subsequent metal plating; printing with electroconductive paste, bonding of metal wires, and like methods. The electroconductive paste generally includes a dispersion of powder of silver, gold, copper, nickel, carbon or the like in a polymeric binder. The polymeric binder includes polyester resins, epoxy resins, acrylic resins, alkyd resins, polyvinyl acetate resins, rubbers, urethane resins, and phenol resins. Otherwise, a wire made of a metal such as Cu may be provided on the transparent conductive layer.

Solar cell module is generally equipped with output terminals for extracting photovoltaic current. Said output terminals are typically in electric connection with the conductive substrate and the collecting electrode, respectively. Generally a metal piece such as a copper tab can be used as output terminal at the conductive substrate side, connected to the conductive substrate by spot welding or soldering. On the other hand, a metal may be electrically connected to the collecting electrode by means of conductive paste or solder.

A plurality of solar cell modules as above detailed may be provided, wherein photovoltaic elements can be connected in series or in parallel according to the desired voltage or current.

The invention will be now described in more detail with reference to the following examples, whose purpose is merely illustrative and not intended to limit the scope of the invention.

EXAMPLES

Raw Materials

PVDF is a VDF homopolymer commercially available under trade name SOLEF® 6008 having a melting point ($T_{m2}$) of 172° C. and a heat of fusion ($\Delta H_{2f}$) of 55 J/g.

Pigment is a ZnS pigment commercially available under the trade name Sachtolich HD-S.

Dispersant is a TFE-perfluoromethyl vinylether (MVE) copolymer having a dynamic viscosity of 5 Pa×s at 280° C. and at a shear rate of 1 rad×sec$^{-1}$, a $T_{m2}$ of 205.9° C., a $\Delta H_{2f}$=6.279 J/g and being composed of 13% by moles of recurring units derived from MVE and 87% by moles of recurring units derived from TFE.

General manufacturing procedure of the compositions of the invention The pigment and the dispersant, both under the form of powder, were pre-mixed in a rapid mixer equipped with a three stages paddles mixer so as to obtain a homogeneous powder mixture having required weight ratio between mentioned ingredients.

To this powder mixture, the required amount of PVDF was then added, and the mixture was stirred at 300 rpm for 3 minutes. Powder mixture was then processed by extrusion in a double screw 30-34 extruder (LEISTRITZ), equipped with 6 temperature zones and a 4 mm-2 holes die. Temperatures set points were set as follows:

TABLE 1

| Feed zone | T1 | T2 | T3 | T4 | T5 |
|---|---|---|---|---|---|
| 180° C. | 190° C. | 200° C. | 200° C. | 200° C. | 210° C. |

Screws speed was set at 100 rpm, with a feed rate of 20%, so as to yield a throughput rate of about 10 kg/h, and a melt pressure of about 30 bar. Extruded strands were cooled in a water bath, dried, calibrated and cut in a pelletizer.

For manufacturing thin films, pellets were processed in a small single screw extruder Braebender (screw speed=25 rpm) equipped with 5 temperature zones, set as below detailed, and a 0.5 mm×100 mm tape die. Upon exit from the die, molten tape was rolled onto two subsequent chill rolls kept at a temperature of 115° C., whose speed was adapted so as to obtain a film thickness of about 50 μm.

TABLE 2

| Feed zone | T1 | T2 | T3 | T4 |
|---|---|---|---|---|
| 230° C. | 230° C. | 230° C. | 240° C. | 240° C. |

Details of weight ratios between ingredients of the compositions are detailed in table 3.

TABLE 3

| Run | Pigment % wt of PVDF | dispersant % wt of pigment | MFI (g/10 min) |
|---|---|---|---|
| 1 C* | — | — | 8.6 |
| 2 | 38.6% | 11.1% | 6.3 |
| 3 C** | 42.9% | — | 6.3 |
| 4 | 60.0% | 11.1% | 6.4 |
| 5 C** | 66.7% | — | 5.5 |

*PVDF alone, used as reference;

**compositions prepared without dispersant.

Films Characterization

Films obtained as above detailed were submitted to both optical and mechanical testing.

Total luminous transmittance was measured according to ASTM D1003, Procedure A, using a Gardner Haze Guard Plus instrument. For avoiding spurious contributions possibly related to surface roughness or defects, specimens were analyzed by immersing film samples in a quartz cell filled with water. Results summarized in table 4 are the average from three determinations on different specimens. Optical absorbance ($\alpha$) was determined from above data, following formula:

$$\alpha(\text{cm}^{-1}) = -\text{Log}_{10}(\text{TT})/t.$$

Yellow and white indices were determined using a Gardner Spectroguide colorimeter according to ASTM E313 standard.

Optical properties are summarized in table 4.

TABLE 4

| Run | Film thickness (μm) | TT (%) | $\alpha$ (cm$^{-1}$) | YI | WI |
|---|---|---|---|---|---|
| 1 C | 48 | 99 | 1 | 0* | 94* |
| 2 | 43 | 6 | 280 | 2 | 94 |
| 3 C | 48 | 4.5 | 280 | 1 | 92 |
| 4 | 33 | 6 | 370 | 0 | 95 |
| 5 C | 37 | 5 | 350 | 0 | 94 |

As apparent from table 4 here above, addition of the dispersant does not impair the optical properties of the films.

Mechanical properties were determined according to ASTM D638, type V, at a temperature of 23° C., both in machine (MD) and transverse direction (TD) of the film. Stress at break ($\sigma_{break}$) and deformation at break ($\epsilon_{break}$) both in MD and TD are summarized in table 5.

TABLE 5

| Run | | $\sigma_{break}$ (MPa) | $\epsilon_{break}$ (%) |
|---|---|---|---|
| 1 C | MD | 76.3 | 444 |
| | TD | 73.2 | 449 |
| 2 | MD | 55.8 | 352 |
| | TD | 38.6 | 121 |
| 3 C | MD | 42.0 | 177 |
| | TD | 37.5 | 37 |
| 4 | MD | 34.0 | 193 |
| | TD | 29.3 | 4.6 |
| 5 C | MD | 36.7 | 62 |
| | TD | 42 | 2.6 |

Stress at break and elongation at break of films obtained from the compositions according to the invention were found to be much higher than those observed when the pigment was compounded alone with the fluoropolymer without using the dispersant of the invention.

Compositions of example 2 and 3C were further processed for manufacturing films in a single screw extruder having a diameter of 45 mm, equipped with a film die having a lip length of 450 mm and a lip width of 0.55 mm and three calendering rolls. Temperature profile and extrusion conditions are summarized in the following tables:

TABLE 6

| Temperature set point | (° C.) |
|---|---|
| Zone 1 (hopper) | 190 |
| Zone 2 (barrel) | 195 |
| Zone 3 (barrel) | 200 |
| Zone 4 (head) | 205 |
| Roll 1 & roll 2 | 115 |
| Roll 3 | 110 |

TABLE 7

| | | |
|---|---|---|
| Pressure | (bar) | 60 |
| Melt temperature | (° C.) | 228 |
| Throughput rate | (kg/h) | 8.0 |
| Screw speed | (rpm) | 15 |
| Calendering rolls speed | (m/min) | 2.7 ÷ 3.0 |

Films having a thickness of about 50 microns were obtained. Number of defects (white spots, holes, fish eyes . . . ) per unitary surface was visually inspected. The ratio between the number of defects per unitary area in film from composition of example 2 and the number of defects per unitary area in film from composition of example 3c was found to be less than 0.2. In other words, film obtained from composition of example 2 was found to yield much better visual appearance than film made from composition of example 3c.

The invention claimed is:

1. A solar cell module, comprising:

at least one photovoltaic element encapsulated between a front layer on its light receiving surface side and a back layer;

wherein the back layer comprises at least one layer of a fluoropolymer composition having a total luminous transmittance (TT) of less than 15%, when measured according to ASTM D1003 on a sample having a thickness of about 50 μm, said composition comprising:

at least one hydrogen-containing fluoropolymer (polymer (A));

at least 35 and up to 80% by weight of polymer (A) of at least one inorganic pigment (pigment (I)); and from 1 to 99% by weight of pigment (I) of at least one per(halo)fluoropolymer chosen among tetrafluoroethylene (TFE) copolymers having a dynamic viscosity at a shear rate of 1 rad×sec$^{-1}$ of less than 100 Pa×sec at a temperature of 280° C. (polymer (B)).

2. The solar cell module of claim 1, wherein said composition possesses an α value of more than 165 cm$^{-1}$, wherein a value is given by the formula:

$$\alpha(cm^{-1}) = -\mathrm{Log}_{10}(TT)/t$$

wherein TT is the total luminous transmittance as determined according to ASTM D1003 and t is the thickness of the sample in cm.

3. The solar cell module of claim 2, said composition possessing a whiteness index (WI) of at least 80, as provided by ASTM E 313.

4. The solar cell module according to claim 1, wherein the polymer (A) is selected from the group consisting of:

(A-1) TFE and/or CTFE copolymers with ethylene, propylene or isobutylene, with a molar ratio per(halo)fluoromonomer(s)/hydrogenated comonomer(s) of from 30:70 to 70:30, optionally containing one or more comonomers in amounts of from 0.1 to 30% by moles, based on the total amount of TFE and/or CTFE and hydrogenated comonomer(s);

(A-2) vinylidene fluoride (VDF) polymers, optionally comprising recurring units, in amount comprised between 0.1 and 15% by moles, derived from one or more fluorinated comonomer(s) different from VDF, and optionally further comprising one or more hydrogenated comonomer(s); and mixtures thereof.

5. The solar cell module of claim 4, wherein the polymer (A) is a VDF polymer (A-2) comprising:

(a') at least 60% by moles by moles of vinylidene fluoride (VDF);

(b') optionally from 0.1 to 15% by moles of a fluorinated comonomer selected from the group consisting of vinylfluoride (VF), chlorotrifluoroethylene (CTFE), hexafluoropropene (HFP), tetrafluoroethylene (TFE), perfluoromethylvinylether (MVE), trifluoroethylene (TrFE), and mixtures therefrom; and (c') optionally from 0.1 to 5%, by moles based on the total amount of monomers (a') and (b'), of one or more hydrogenated comonomer(s).

6. The solar cell module of claim 1, wherein the pigment (I) is selected from the group consisting of oxides, sulfides, oxides hydroxides, silicates, sulfates, carbonates, and mixtures thereof.

7. The solar cell module of claim 6, wherein the pigment (I) is a white pigment selected from the group consisting of $TiO_2$ pigments, zinc oxide pigments, zinc sulphide pigments, lithopone pigments, white lead pigments, barium sulphate, and corresponding complex pigments obtained from coating of above mentioned pigments on suitable inorganic carriers.

8. The solar cell module of claim 7, wherein the pigment (I) is selected from the group consisting of zinc oxide pigments and zinc sulphide pigments.

9. The solar cell module according to claim 1, wherein the polymer (B) is selected among TFE copolymers comprising recurring units derived from at least one per(halo)fluoromonomer selected from the group consisting of:

perfluoroalkylvinylethers complying with formula $CF_2{=}CFOR_{f1'}$, in which $R_{f1'}$ is a $C_1$-$C_6$ perfluoroalkyl;

perfluoro-oxyalkylvinylethers complying with formula $CF_2{=}CFOX_0$, in which $X_0$ is a $C_1$-$C_{12}$ perfluorooxyalkyl having one or more ether groups;

$C_3$-$C_8$ perfluoroolefins; and per(halo)fluorodioxoles of formula;

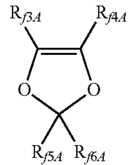

wherein each of $R_{f3A}$, $R_{f4A}$, $R_{f5A}$, $R_{f6A}$, equal to or different from each other, is independently a fluorine atom, or a $C_1$-$C_6$ perfluoroalkyl group, optionally comprising one or more oxygen atom.

10. The solar cell module of claim 9, wherein the polymer (B) is a tetrafluoroethylene (TFE)/perfluoromethylvinylether (MVE) copolymer consisting essentially of:

from 3 to 25% by moles of recurring units derived from MVE; and from 97 to 75% by moles of recurring units derived from TFE.

11. A method for protecting a solar cell module, comprising:

applying a film or sheet to said solar cell module;

wherein the film or sheet comprises a fluoropolymer composition having a total a total luminous transmittance (TT) of less than 15%, when measured according to ASTM D1003 on a sample having a thickness of about 50 μm, said composition comprising;

at least one vinylidene fluoride (VDF) polymer (polymer (A)), optionally comprising recurring units, in amount comprised between 0.1 and 15% by moles, derived from one or more fluorinated comonomer(s) different from VDF, and optionally further comprising one or more hydrogenated comonomer(s); and mixtures thereof;

at least 35 and up to 80% by weight of polymer (A) of at least one inorganic pigment selected from the group consisting of oxides, sulfides, oxides hydroxides, silicates, sulfates, carbonates, and mixtures thereof (pigment (I)); and from 1 to 99% by weight of pigment (I) of at least one per(halo)fluoropolymer chosen amore tetrafluoroethylene (TFE)/perfluoromethylvinylether (MVE) copolymers having having a dynamic viscosity at a shear rate of 1 rad×sec$^{-1}$ of less than 100 Pa×sec at a temperature of 280° C. and consisting essentially of:

from 3 to 25% by moles of recurring units derived from MVE; and from 97 to 75% by moles of recurring units derived from TFE (polymer (B)).

12. The method for protecting a solar cell module of claim 11, wherein the polymer (A) is a VDF polymer (A-2) comprising:

(a') at least 60% by moles by moles of vinylidene fluoride (VDF);

(b') optionally from 0.1 to 15% by moles of a fluorinated comonomer selected from the group consisting of vinylfluoride (VF), chlorotrifluoroethylene (CTFE), hexafluoropropene (HFP), tetrafluoroethylene (TFE), perfluoromethylvinylether (MVE), trifluoroethylene (TrFE), and mixtures therefrom; and (c') optionally from 0.1 to 5%, by moles based on the total amount of monomers (a') and (b'), of one or more hydrogenated comonomer(s).

13. A solar cell module comprising:

at least one photovoltaic element encapsulated between a front layer on its light receiving surface side and a back layer, said back layer comprising at least one layer comprising a fluoropolymer composition having a total a total luminous transmittance (TT) of less than 15%, when measured according to ASTM D1003 on a sample having a thickness of about 50 μm, said composition comprising:

at least one vinylidene fluoride (VDF) polymer (polymer (A)), optionally comprising recurring units, in amount comprised between 0.1 and 15% by moles, derived from one or more fluorinated comonomer(s) different from VDF, and optionally further comprising one or more hydrogenated comonomer(s); and mixtures thereof;

at least 35 and up to 80% by weight of polymer (A) of at least one inorganic pigment selected from the group consisting of oxides, sulfides, oxides hydroxides, silicates, sulfates, carbonates, and mixtures thereof (pigment I)); and from 1 to 99% by weight of pigment (I) of at least one per(halo)fluoropolymer chosen among tetrafluoroethylene (TFE)/perfluoromethylvinylether (MVE) copolymers having having a dynamic viscosity at a shear rate of 1 rad×sec$^{-1}$ of less than 100 Pa×sec at a temperature of 280° C. and consisting essentially of:

from 3 to 25% by moles of recurring units derived from MVE; and from 97 to 75% by moles of recurring units derived from TFE (polymer (B)).

14. The solar cell module of claim 13, wherein the polymer (A) is a VDF polymer (A-2) comprising:

(a') at least 60% by moles by moles of vinylidene fluoride (VDF);

(b') optionally from 0.1 to 15% by moles of a fluorinated comonomer selected from the group consisting of vinylfluoride (VF), chlorotrifluoroethylene (CTFE), hexafluoropropene (HFP), tetrafluoroethylene (TFE), perfluoromethylvinylether (MVE), trifluoroethylene (TrFE), and mixtures therefrom; and (c') optionally from 0.1 to 5%, by moles based on the total amount of monomers (a') and (b'), of one or more hydrogenated comonomer(s).

* * * * *